United States Patent
Yoshida et al.

(10) Patent No.: US 6,591,493 B1
(45) Date of Patent: Jul. 15, 2003

(54) METHOD OF PREVENTING A NOZZLE DROP IN A COMPONENT MOUNTING APPARATUS

(75) Inventors: Yoshihiro Yoshida, Neyagawa (JP); Osamu Okuda, Yamanashi (JP); Akira Kabeshita, Hirakata (JP); Naoyuki Kitamura, Yamanashi (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 314 days.

(21) Appl. No.: 09/706,900

(22) Filed: Nov. 6, 2000

Related U.S. Application Data

(62) Division of application No. 09/161,334, filed on Sep. 25, 1998, now Pat. No. 6,240,628.

(30) Foreign Application Priority Data

Sep. 29, 1997 (JP) .............................. 9-264687

(51) Int. Cl.$^7$ ................................ H05K 3/30
(52) U.S. Cl. ............................ 29/832; 29/740; 29/743; 29/721; 29/832
(58) Field of Search ........................ 29/721, 739, 740, 29/741, 743, 832, 837, DIG. 44, 831; 294/64.1; 70/181, 198; 188/67; 414/752

(56) References Cited

U.S. PATENT DOCUMENTS

| | | | |
|---|---|---|---|
| 3,472,535 A | | 10/1969 | Kinley |
| 4,791,855 A | | 12/1988 | Matsui |
| 4,839,961 A | | 6/1989 | Vermeer |
| 4,951,383 A | | 8/1990 | Amao et al. |
| 5,195,235 A | * | 3/1993 | Mifuji .......................... 29/721 |
| 5,351,789 A | | 10/1994 | Tochihara et al. |
| 5,628,107 A | * | 5/1997 | Nushiyama et al. .......... 29/740 |
| 5,657,533 A | * | 8/1997 | Fukui et al. .................. 29/740 |
| 6,012,222 A | * | 1/2000 | Asai et al. .................... 29/832 |

* cited by examiner

Primary Examiner—Carl J. Arbes
Assistant Examiner—Tai Nguyen

(57) ABSTRACT

A method of preventing a nozzle or nozzles from dropping in a component mounting apparatus include gripping the nozzle structures with pivotal levers that are biased to a closed position. The pivotal levers are released after activation of the nozzles to permit appropriate movement for picking up, inspecting, orientating and locating electronic components on a substrate with the nozzles. During the operation of the mounting head, the levers are maintained in a release position against a biasing force and at the end of the operation, the biasing force can then cause the levers to close and support the nozzles in a gripping manner.

9 Claims, 6 Drawing Sheets

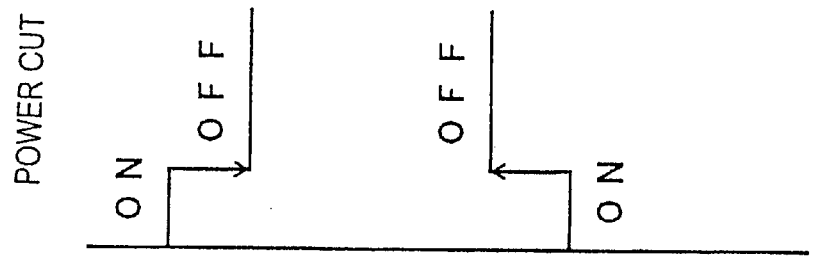
Fig. 5C POWER CUT
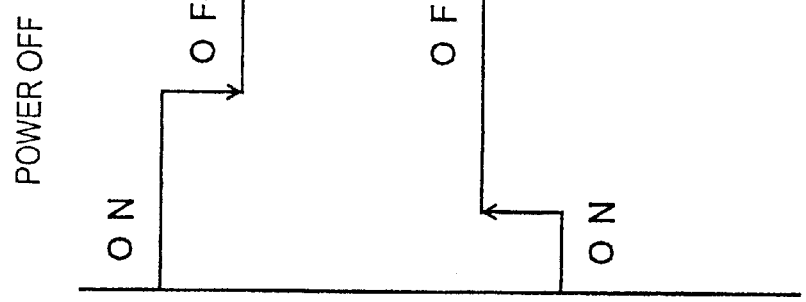
Fig. 5B POWER OFF
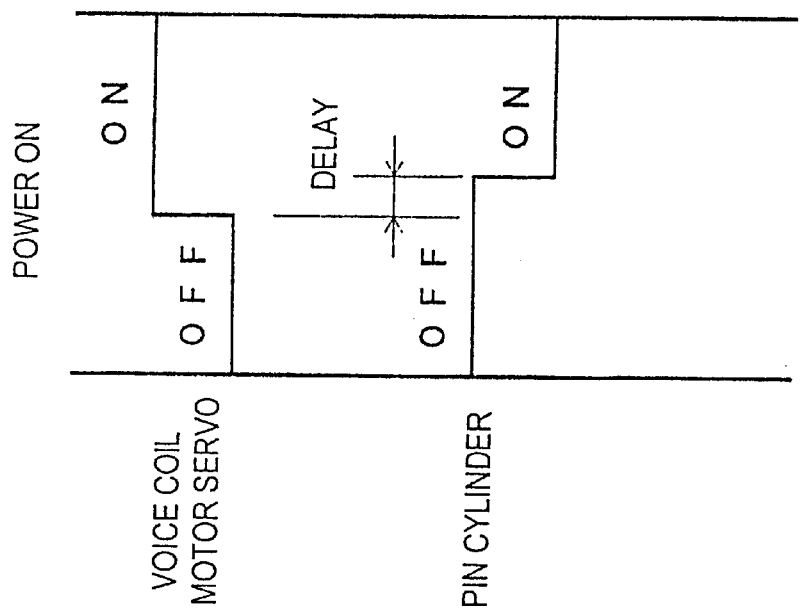
Fig. 5A POWER ON

METHOD OF PREVENTING A NOZZLE DROP IN A COMPONENT MOUNTING APPARATUS

This is a division of 09/161,334 filed Sep. 25, 1998, now U.S. Pat. No. 6,240,628.

BACKGROUND OF THE INVENTION

1. Field of the Invention

The present invention relates to a component mounting apparatus which is applied to the mounting of an electronic component onto an electronic circuit substrate, and more particularly, to a nozzle drop prevention device, which is installed in a mounting head equipped with a nozzle for picking up a component.

2. Description of Related Art

With the propagation of leadless electronic components (chip component) in recent years, the shape and size of components have been diversified, and in an electronic component mounting apparatus for mounting these electronic components, there have been demands for high-speed operation, high precision, high productivity, and high reliability.

A conventional electronic component mounting apparatus will be hereinafter described with reference to FIG. 7. In FIG. 7, the electronic component mounting apparatus comprises a mounting head 51 equipped with a nozzle for picking up an electronic component, a suction device 52 for attracting the electronic component with the nozzle, an XY robot 53 for moving the mounting head 51 in the X and Y directions, and a control device 54 which controls actions of the mounting head 51, the suction device 52, and the XY robot 53. It is noted that FIG. 7 shows only the main elements of the mounting head 51, and illustration of, for example, a body part is omitted.

Reference numeral 55 represents a spline shaft, to which two nuts 56, 57 are coupled such as to be movable in a direction of its axis. These nuts 56, 57 are supported in the body part (not shown) of the mounting head 51 via bearings 58, 59, respectively. By this construction, the spline shaft 55 is movable in the direction of its axis as well as rotatable around its axis, and it is driven to rotate by a motor 60 mounted on the mounting head 51 via a pulley 61, belt 62, and another pulley 63.

At the distal end 55a of the spline shaft 55 is mounted a nozzle 65 for picking up the electronic component 64. Inside the nozzle 65, a filter 66 is provided for preventing dust from entering into the nozzle when a suctional force is applied. The spline shaft 55 is pushed upwards by a compression spring 68 via a bearing 67 which is to be slidable in a circumferential direction, and by applying a pressing force from a voice coil motor 69, the spline shaft 55 or the nozzle 65 is lowered to perform pick up and mounting actions of the electronic component 64.

The actions of the component mounting apparatus with the above described construction will be explained. The control device 54 activates the XY robot 53 to move the mounting head 51 to a component pick-up position where the electronic component is picked up. Then, by the control of the control device 54, the voice coil motor 69 is driven so as to compress the compression spring 68, by which the nozzle 65 is lowered via the spline shaft 55, and at the same time the suction device 52 is driven so that the nozzle 65 picks up the electronic component 64 by suctional force. Next, the nozzle 65 is lifted by means of the voice coil motor 69. The XY robot 53 is then driven to move the mounting head 51 to a component mounting position above the circuit substrate, after which the nozzle 65 is lowered by means of the voice coil motor 69 so that the electronic component 64 is mounted on the circuit substrate. When the power source is off or at the time of a power failure, the pressing force is not applied from the voice coil motor 69, and thus the spline shaft 55 or nozzle 65 is prevented from dropping due to the force of the compression spring 68 which is pushing the bearing 67 upwards.

However, in the above described construction, since the spline shaft 55 is urged upwards by the force of the compression spring 68, the voice coil motor 69 needs to have a pressing force greater than the force of the compression spring 68, alone wherefore there is a problem that precise control of pressing force for the mounting purpose cannot be achieved. Also, the voice coil motor 69 needs to have a capacity greater than necessary, thus causing the size of the voice coil motor or the mounting head 51 to become bulky. Furthermore, in order for minimizing the change of the compression spring 68 due to compression, it is necessary to make enough room for the compression spring 68, whereby the mounting head 51 becomes elongated in a vertical direction.

BRIEF SUMMARY OF THE INVENTION

In view of the above problems in the prior art, an object of the present invention is to provide a nozzle drop prevention device in a component mounting apparatus by which, without using a compression spring for pushing the nozzle upwards, the nozzle is prevented from falling when power is turned off or cut with a simple and compact construction, and by which a pressing force applied to the nozzle can be precisely controlled with a compact voice coil motor.

The nozzle drop prevention device according to the present invention is used in a component mounting apparatus including a mounting head in which a nozzle is disposed at a distal end of a shaft which is movable upwards and downwards for picking up and mounting a component, and comprises: a shaft driving means for driving the shaft upwards and downwards; a pair of first levers which is swingable in an open and a close directions and is forced in the close direction by a compression spring to hold the shaft in a gripping manner; a release pin for opening the first levers opposite the pivotally connected end by engaging with an open/close end of the first levers; a second lever for driving the release pin toward the open/close end of the first levers; by a driving means and a tension spring for forcing the second lever in a reverse direction with respect to a direction in which the release pin is driven; wherein during an operation of the mounting head the shaft driving means is activated the first levers are opened via the second lever by driving the release pin, only after the shaft and at the end of the operation, the driving of the release pin by the second lever is released, so that the shaft is vertically supported by the first levers. Since the shaft can move upwards and downwards freely when the mounting head is in operation, pressure application control can be precisely made with a compact shaft driving means, and the nozzle can be prevented from dropping since the shaft is supported by the first lever at the end of the operation, and even when there is a power failure where controlling actions are not effectuated, nozzle drop can be prevented by the action of the spring, by which mechanical damages can be avoided and high reliability is realized.

Instead of providing a spring for forcing the second lever in a reverse direction with respect to a direction in which the release pin is driven, a reciprocating moving means for moving the second lever in a release pin driving direction and in a reverse direction with respect to the driving direction can be provided, with which, when the mounting head is in operation, only after the shaft driving means is activated are the first levers opened via the second lever by driving the release pin in driving direction and at the end of the operation, the driving of the release pin by the second lever is released, so that the shaft is vertically supported by the first levers. In this case, since the second lever is not forced by the spring in the direction opposite to the driving direction, the speed of response when the second lever is driven in the release pin driving direction is increased, i.e., the response of actions in both directions is enhanced, by which a high-speed mounting operation is realized. By employing a double-acting air cylinder device as the reciprocating moving means, high-speed operation of the second lever is possible by a simple construction with an air source and a solenoid valve.

In the case where the mounting head is equipped with a plurality of nozzles, the release pin is also provided in plurality so as to correspond to each of the nozzles, and the release pins are driven in synchronism by the second lever, by which a plurality of shafts can be collectively supported in a vertical direction and the nozzles can be prevented from dropping.

The component mounting method of the present invention, in which a component is picked up and mounted by a nozzle attached to a lower end of a shaft which is movable upwards and downwards, is characterized in that the shaft is kept fixed in a grasping manner, and only when a component is picked up or mounted is the grip of the shaft released, and the shaft is moved upwards and downwards by a vertical moving means. According to this method, since the shaft is freely movable when mounting a component, pressure application control can be precisely made with a compact vertical moving means.

Furthermore, the component mounting apparatus of the present invention comprises a shaft which is movable upwards and downwards; a nozzle mounted at a lower end of the shaft for carrying out component pick up and mounting operations; a gripping means for fixedly gripping the shaft at a predetermined position; a shaft driving means for moving the shaft upwards and downwards; and a grip release means for releasing the grip of the shaft by the gripping means only when picking up and mounting a component, by which the above method of mounting a component can be carried out and the above effects can be achieved.

By constructing a component mounting apparatus such that the gripping means comprises a pair of first levers pivotally connected at one end such that the first levers can swing in an open and close direction and is forced in the close direction by a spring to grip the shaft, and the grip release means comprises a release pin which causes the first levers to open by engaging releases grooves at an open/close end of the first levers and a means for driving the release pin toward the open/close end of the first levers only when picking up and mounting a component, the grip and the release of the grip of the shaft can be effected with a simple arrangement.

Other objects and features of the invention will become clear through the detailed description of the invention and the drawings provided below.

BRIEF DESCRIPTION OF THE DRAWINGS

FIGS. 5A–5C are diagrams showing timing of actions of a pin cylinder for locking a spline shaft in the embodiment;

DESCRIPTION OF THE PREFERRED EMBODIMENTS

One embodiment of the component mounting apparatus and its nozzle drop prevention device will be hereinafter described with reference to FIGS. 1 to 5.

Figure 1:
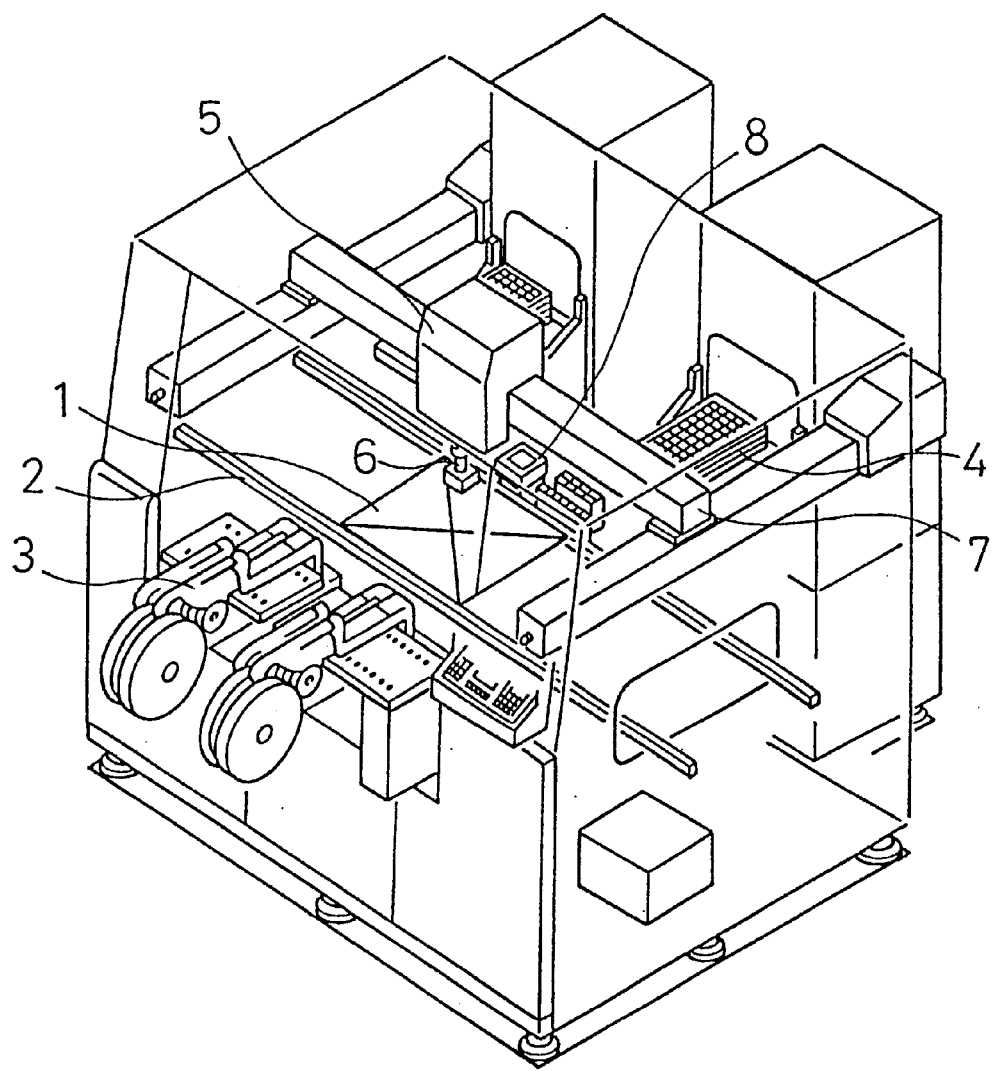
FIG. 1 is a perspective view showing the schematic overall construction of a component mounting apparatus in one embodiment of the present invention.

Referring to FIG. 1, a circuit substrate 1 is loaded and unloaded by a transfer section 2, and retained at a predetermined position during production. Reference numerals 3 and 4 both represent component feeding sections which accommodate and supply electronic components to be mounted on the circuit substrate 1; the component feeding section 3 is a reel type feeder in which components are accommodated in the form of a reel, and the component feeding section 4 is a tray type feeder in which components are housed on a tray.

Reference numeral 5 is a mounting head which effects upward, downward, and rotating movements of a nozzle 6 for picking up the electronic component, and this mounting head 5 is mounted on an XY robot 7 for movements in X and Y directions. When picking up the electronic component, the mounting head 5, i.e., the nozzle 6 is moved by the XY robot 7 to a component supplying position at the component feeding section 3 or 4, and lowered for attracting the component, after which the nozzle is lifted upward.

The state of the electronic component held by the nozzle 6 is imaged by a component recognition camera 8, and it is judged whether correction of the angle of the component is required or not before mounting it on the circuit substrate 1 based on the image information. The electronic component held by the nozzle 6 is moved in the X and Y directions to a prescribed position above the circuit substrate 1 by the movements of the mounting head 5 which are effected by the XY robot 7. Then, by the action of the mounting head 5, the nozzle 6 is lowered, so that the electronic component is mounted on the prescribed component mounting position on the circuit substrate 1, where the holding of the electronic component is released. By repeating the above described actions, each of the electronic components supplied from the component feeding section 3 or 4 is mounted on the circuit substrate 1.

Figure 2:
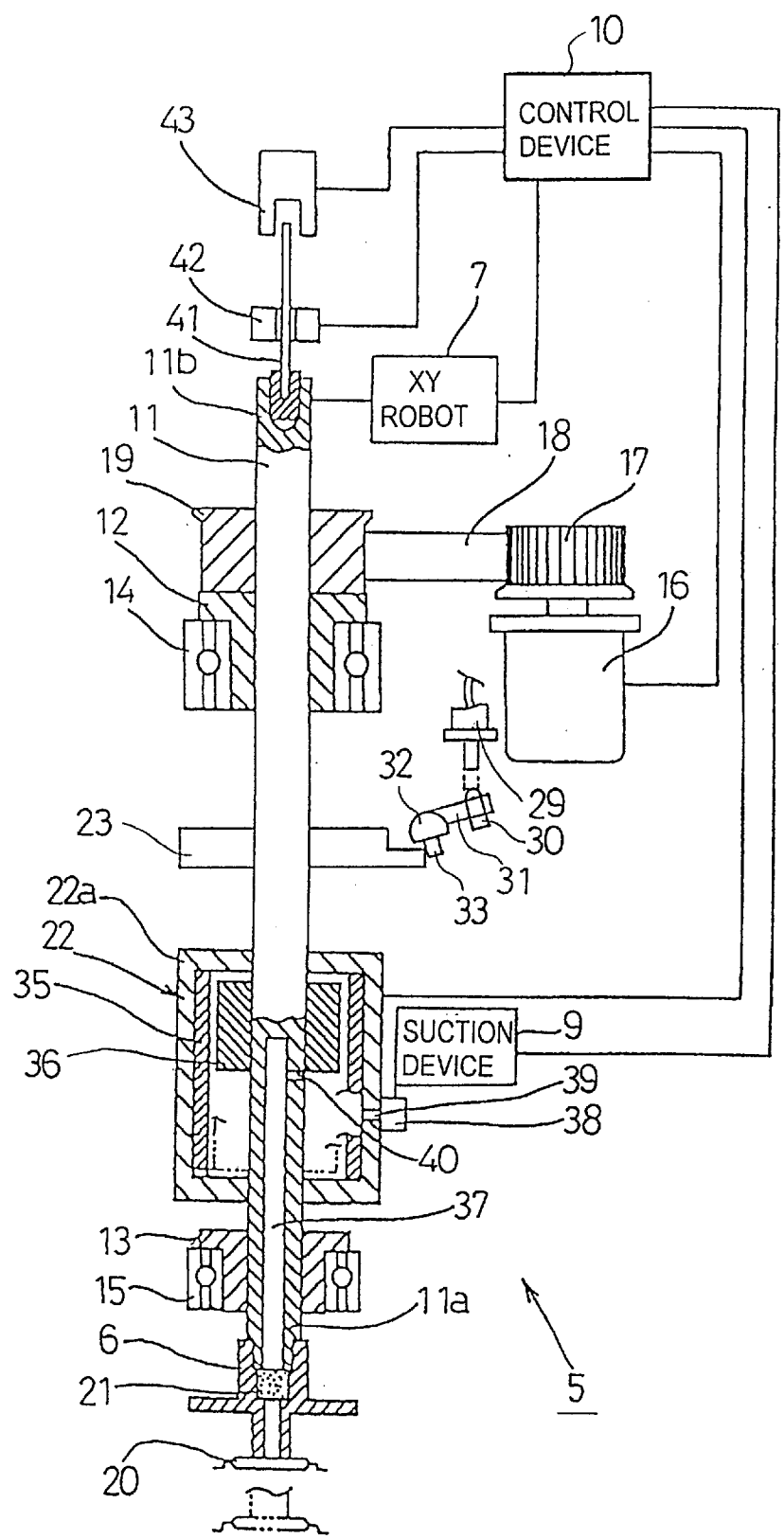
FIG. 2 is a partial longitudinal section view showing a schematic construction of a mounting head in the embodiment.

FIG. 2 shows a detailed construction of the mounting head 5, together with the XY robot 7, a suction device 9 for attracting the electronic component with the nozzle 6, and a control device 10 for controlling the actions of the mounting head 5, the XY robot 7, and the suction device 9. It is noted that the XY robot 7 actually drives the mounting head 5, although it is illustrated in FIG. 2 for the sake of convenience such that the XY robot 7 directly drives the spline shaft 11.

In the mounting head 5, a pair of nuts 12, 13 are coupled to the spline shaft 11 such as to be movable along an axial direction of the shaft, and these nuts 12, 13 are supported on a body part (not shown) of the mounting head 5 via bearings 14, 15. By this structure, the spline shaft 11 is supported such as to be movable in an axial direction thereof as well as rotatable around its axis, and is driven to rotate by a motor 16 mounted on the mounting head 5 via a pulley 17, a belt 18, and a pulley 19.

The spline shaft 11 has at its distal end 11a nozzle 6 for picking up an electronic component 20 by a suctional force. There is a filter 21 provided inside the nozzle 6 for preventing dust from entering thereinto when suction is effected. A voice coil motor 22 is provided for driving the spline shaft 11 upwards and downwards, by which the spline shaft 11, i.e., the nozzle 6 is moved upwards and downwards for carrying out electronic component pick up and mounting operations.

Figure 3:
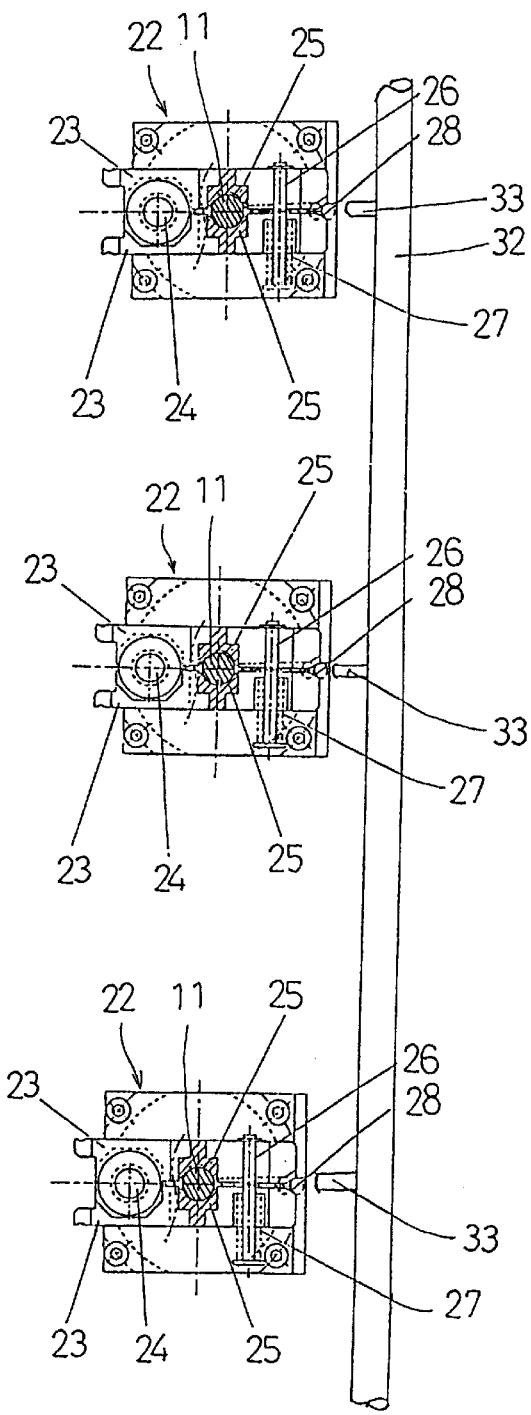
FIG. 3 is a plan view showing the primary construction of the embodiment.

Furthermore, as shown in FIGS. 2 and 3, a pair of first levers 23 which lock and release the spline shaft 11 is provided above the voice coil motor 22. The pair of first levers 23 are pivotally supported at its one end around a pivotal pin 24 such as to swing in open and close directions; urethane rubber 25 is provided in the middle part of the first levers 23 with which the spline shaft 11 is gripped; at the other end of the first levers 23 are a spring shaft 26 and a compression spring 27 for forcing the first levers 23 in the close direction so as to lock the spline shaft 11 in a grasping manner; and a release groove 28 is formed at opposing corners on the edge at the other end of the first levers 23.

Figure 4:
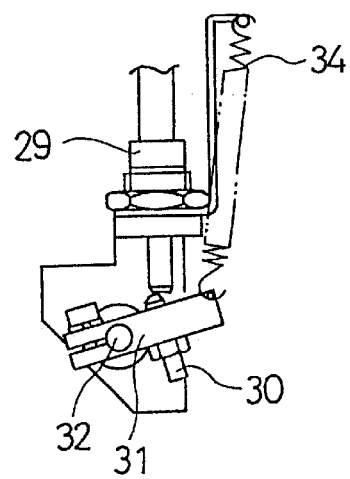
FIG. 4 is a side elevation view showing the primary construction of the embodiment.

As shown through FIGS. 2 to 4, a second lever 32 which extends along a direction of arrangement of the plurality of spline shafts 11 is activated by operating a bracket 31 to swing by means of a pin cylinder 29 and a ball plunger 30. Release pins 33 are fixed to the second lever 32, each of them corresponding to the respective pair of first levers 23 disposed on each of the spline shafts 11, and these release pins 33 are inserted into the respective opposing release grooves 28 by the action of the second lever 32 so as to cause the first levers 23 to open, thus allowing the spline shaft 11 to be driven by the voice coil motor 22 upwards and downwards. The bracket 31 is forced by a tension spring 34 in a direction to move the release pins 33 away from the release grooves 28.

In FIG. 2, reference numeral 22a is a casing of the voice coil motor 22, 35 is a voice coil, and 36 is a magnet. The suction device 9 and a hollow part 37 of the spline shaft 11 which is formed so as to communicate with the nozzle 6 are communicated with each other through an air joint 38, a through hole 39 formed in the casing 22a of the voice coil motor 22, and a through hole 40 provided in the spline shaft 11. Further, a magnetic scale 41 is provided at the uppermost end 11b of the spline shaft 11, where the vertical position of the spline shaft 11 is detected by a magnetic sensor 42, as well as an original position of the spline shaft 11 is detected by the detection of the uppermost end of the magnetic scale 41 by means of a transmission sensor 43.

Actions of the component mounting apparatus with the above described construction will be explained. Referring to FIG. 5A, the apparatus is constructed such that, when power source is turned on to activate the servo control of the voice coil motor 22, only after a certain period of delay is the pin cylinder 29 switched on. After that, component pick up and mounting operations are started.

First, the XY robot 7 is activated by the control of the control device 10 to move the mounting head 5 to a component pick-up position where an electronic component is to be picked up. Then, the pin cylinder 29 is driven by the control of the control device 10 so as to push down the ball plunger 30 fixed to the bracket 31 downwards, so that the plurality of release pins 33 attached to the second lever 32 are inserted into and engaged with the release grooves 28 of the first levers 23, thereby causing the first levers 23 open opened against the force of the compression spring 27, bringing the urethane rubber 25 of the first levers 23 apart from the spline shaft 11. Then, the spline shaft 11 is lowered by the voice coil motor 22 to bring down the nozzle 6, and at the same time the suction device 9 is driven to allow the nozzle 6 to pick up the electronic component 20.

Next, the nozzle 6 is moved upward by means of the voice coil motor 22. Then, the XY robot 7 is driven to move the mounting head 5 to the component mounting position on the electronic circuit substrate, where the nozzle 6 is lowered by the voice coil motor 22, so as to mount the electronic component 20 on the circuit substrate.

After the series of these actions has been completed, the pin cylinder 29 is driven by the control of the control device 10 for causing the ball plunger 30 which has been pressed downwards to return upwards so as to allow the plurality of release pins 33 mounted on the second lever 32 to be released from the release grooves 28 of the first levers 23, by which the first levers 23 are closed by the function of the compression spring 27, and the spline shaft 11 is locked by the first levers 23 in a grasping manner through the urethane rubber 25.

When the power source is turned off, the pin cylinder 29 is switched off prior to the switching off of the servo control of the voice coil motor 22 as shown in FIG. 5B. At the time of power failure in an emergency, since the control actions by the control device 10 are not effectuated, which means the voice coil motor 22 cannot support the spline shaft 11, the spline shaft 11, i.e., the nozzle 6 will fall by its own weight, but since the tension spring 34 mounted to the bracket 31 instantly causes the ball plunger 30 fixed to the bracket 31 to return upwards, the plurality of release pins 33 attached to the second lever 32 are released from the release grooves 28 of the first levers 23, which causes the first levers 23 which have been opened to be closed by the function of the compression spring 27, and the spline shaft 11 is locked in a grasping manner with the urethane rubber 25. Since the tension force of the tension spring 34 is stronger than the force with which the pin cylinder 29 presses down the ball plunger 30 when power supply is cut, the spline shaft 11 can be grasped instantaneously even when there is an unexpected power failure.

Figure 6A:
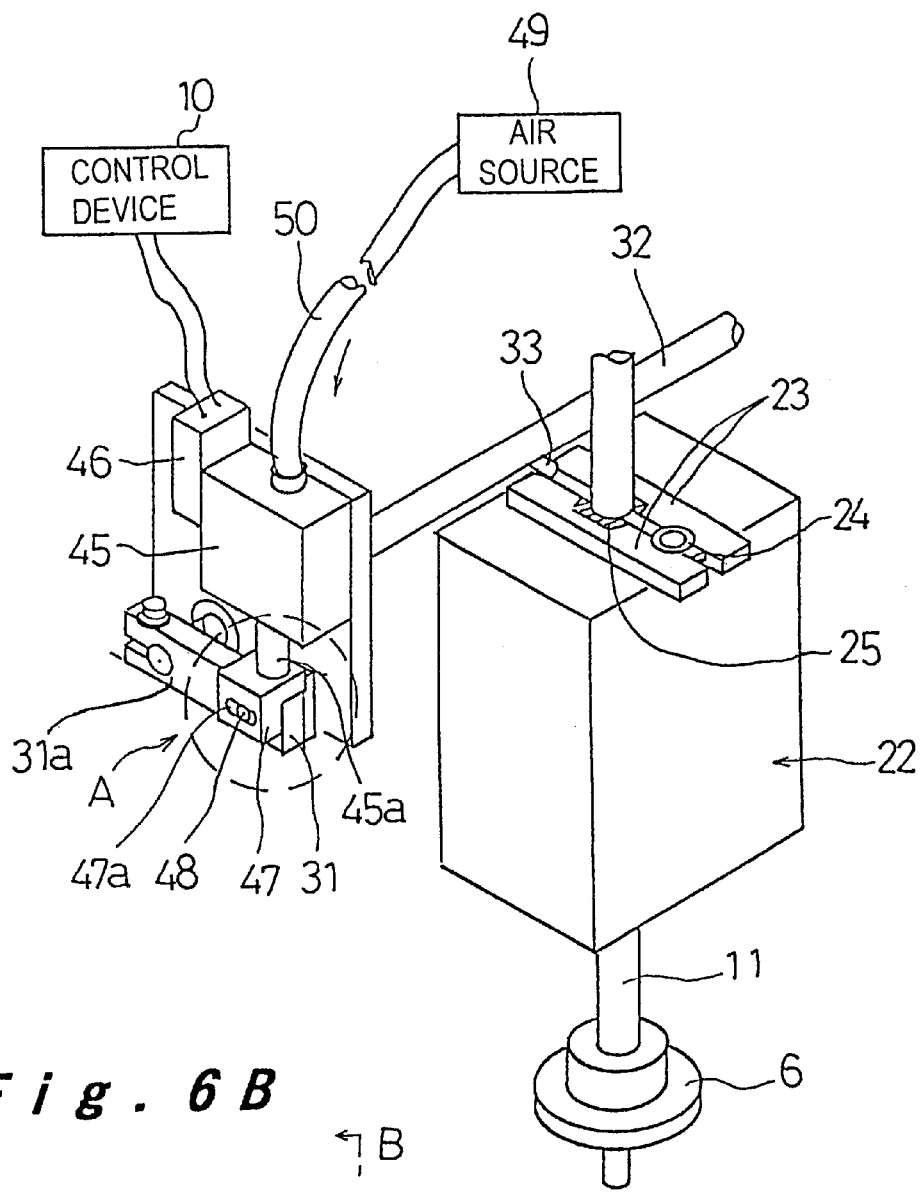
FIG. 6A is a perspective view.
Figure 6B:
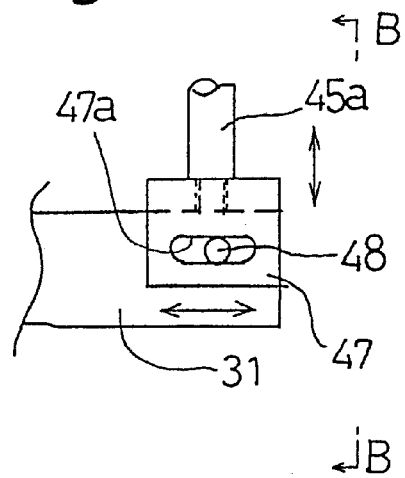
FIG. 6B is a side elevation view of the part A in FIG. 6A.
Figure 6C:
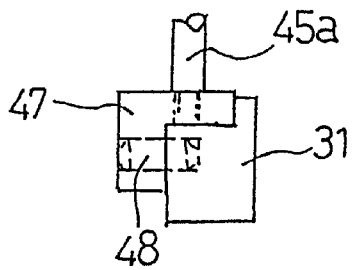
FIG. 6C is a view taken along the line B—B of FIG. 6B, all illustrating the primary construction of the nozzle drop prevention device in the component mounting apparatus of the present invention in another embodiment.
Figure 7:
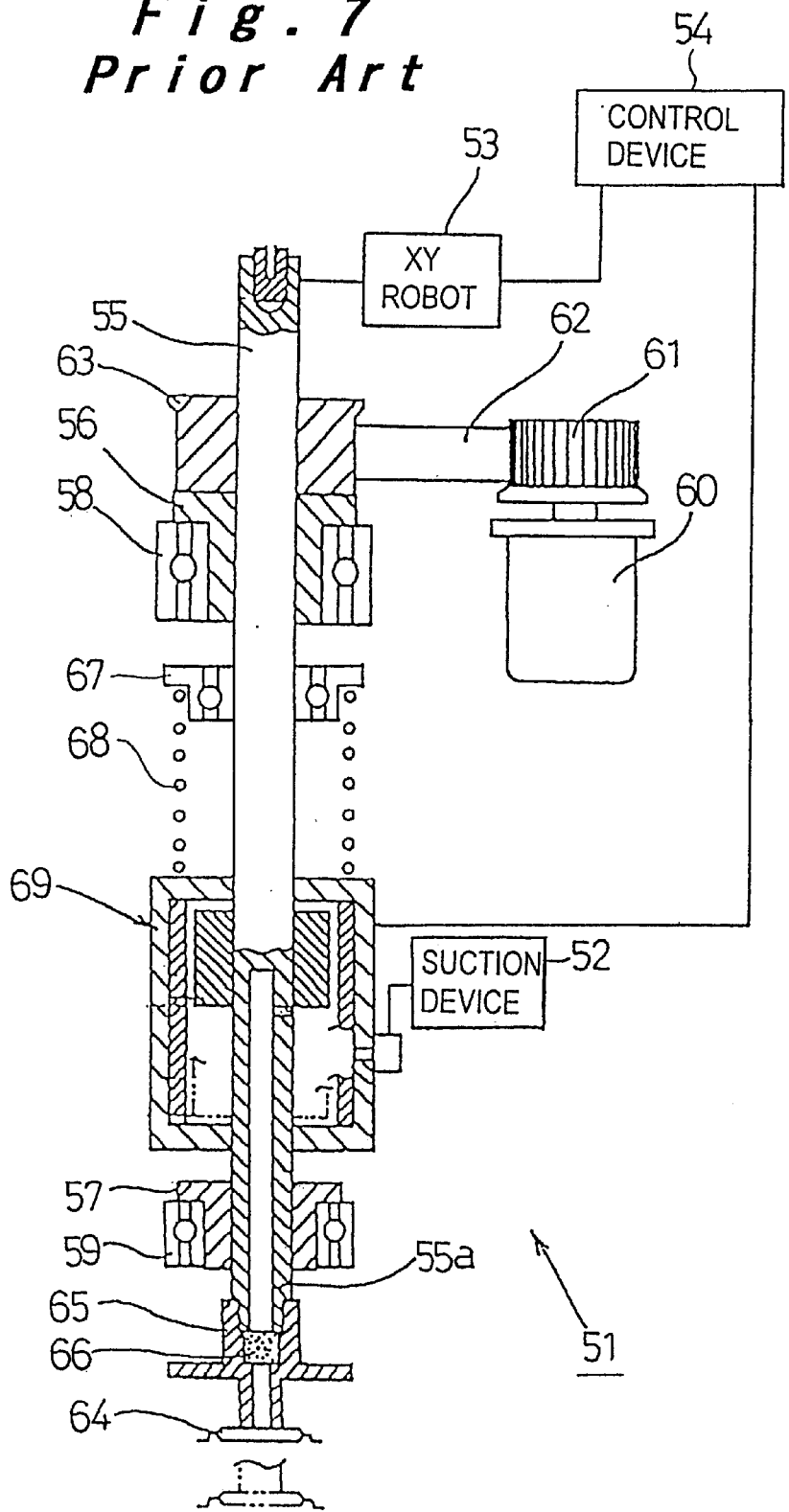
FIG. 7 is a partial longitudinal section view showing the schematic construction of a mounting head in a conventional component mounting apparatus.

Next, another embodiment of the present invention will be explained. In the above described embodiment, the pin cylinder 29 is used for moving the bracket 31 in a direction of driving the release pins 33, and the tension spring 34 is used for effecting a returning action thereof in a reverse direction, while in this embodiment, as shown in FIG. 6, a double-acting cylinder 45 is employed. The double-acting cylinder 45 is constructed such that a solenoid valve 46 is turned on upon receiving signals from the control device 10, by which cylinder chambers into which compression air supplied from an air source 49 through an air tube 50 is introduced are switched over, so that a cylinder shaft 45a is extended, while, when signals from the control device 10 stop, the solenoid valve 46 is turned off, upon which the cylinder chambers into which the compression air supplied from the air source 49 through the air tube 50 is introduced are switched over, so that the cylinder shaft 45a is retracted.

At the distal end of the cylinder shaft 45a, a connecting block 47 is fixedly attached in contact with a lateral side of the bracket 31. An elongated hole 47a is formed in the connecting block 47 in a direction orthogonal to its moving direction, into which a connecting pin 48 projected from the lateral side at the distal end of the bracket 31 is coupled. The end of the second lever 32 is fixedly inserted into a fixing hole 31a provided at the base end of the bracket 31. Thus, when the cylinder shaft 45a is in the retracted position, the bracket 31 is swung upward to release the release pins 33 from the release grooves 28, causing the spline shaft 11 to be locked in a grasping manner. On the other hand, when the cylinder shaft 45a is in the extended position, the bracket 31 is swung downward, allowing the release pins 33 to engage the release grooves 28 to open the first levers 23, thus releasing the lock of the spline shaft 11.

In the first embodiment which was previously described, if the force of the tension spring 34 were set strong in a order to enhance the response in locking action of the spline shaft 11, the speed of response would decrease when releasing the spline shaft 11 by moving the second lever 32 in the release pin 33 driving direction against the force of the tension spring 34. On the other hand, since there is no need for moving the second lever 32 in the release pin 33 driving direction against the force of the tension spring 34 in this embodiment, the speed of response is increased, and since the action in the reverse direction is carried out with high response by the double-acting cylinder 45, the speed of response in both actions can be enhanced, whereby it is possible to realize a high-speed mounting operation.

While a preferred embodiment of the invention has been described using specific terms, such description is for illustrative purposes only, and it is to be understood that changes and variations may be made without departing from the spirit or scope of the following claims.

What is claimed is:

1. A component mounting method in which a component is picked up and mounted by a nozzle attached to a lower end of a shaft which is movable upwards and downwards, characterized in that the shaft is kept to be fixed in a grasping manner, and only when a component is picked up or mounted is the grip of the shaft released, and the shaft is moved upwards and downwards by a vertical moving means comprising a voice coil motor, wherein the voice coil motor controls a pressing force applied to the nozzle.

2. A method of preventing a nozzle from uncontrolled movement in a component mounting apparatus including a mounting head in which a nozzle is disposed at a distal end of a shaft which is movable upwards and downwards for picking up and mounting a component, comprising:
   driving the shaft upwards and downwards with a shaft driving unit comprising a voice coil motor configured to control a pressing force applied to the nozzle;
   activating a pair of first levers which are swingable in an open and a close direction and are urged in the close direction such as to hold the shaft in a gripping manner;
   providing a release member that can contact the first levers;
   biasing the release member to a position which permits the first lever to grip the shaft; and
   driving the release member against the bias to enable the mounting head to be operative, only after the shaft driving unit is activated and the first levers are opened by driving the release member, and when the operation is ended, the driving of the release member is released, so that the shaft is vertically supported by the first levers.

3. The method of claim 2 wherein a plurality of nozzles are on the mounting head and a plurality of release members are driven to release respective nozzles.

4. The method of claim 2 wherein a single second lever drives each of the plurality of release members.

5. A method of preventing the nozzle from uncontrolled movement in a component mounting apparatus including a mounting head in which a nozzle is disposed at a distal end of a shaft for picking up and mounting components, comprising:
   providing a shaft driving unit for driving the shaft upwards and downwards, the shaft driving unit comprising a voice coil motor configured to control a pressing force applied to the nozzle;
   providing a pair of first levers pivotally connected at one end such that the pair of first levers can swing in an open and close direction, and the shaft is between the pair of first levers;
   forcing the pair of first levers in the close direction to hold the shaft;
   providing a release pin for opening the pair of first levers by engaging the other end of the pair of first levers opposite the pivotally connected end;

providing a second lever connected to the release pin for moving the release pin toward and away from the other end of the pair of first levers; and moving the second lever in a driving direction that moves the release pin toward the other end of the pair of first levers and in a reverse direction that moves the release pin away from the other end of the pair of first levers.

6. The method of claim 5, wherein during an operation of the mounting head, opening the pair of first levers by moving the second lever in the driving direction, only after the shaft driving unit is activated, and at the end of the operation of the mounting head, the pair of first levers are closed by moving the second lever in the reverse direction, so that the shaft is vertically supported by the pair of first levers.

7. The method of claim 6, wherein the mounting head further comprises a plurality of second nozzles and a plurality of second release pins corresponding to the plurality of second nozzles wherein each of the second release pins is connected to the second lever and released by moving the second lever.

8. A method of preventing a nozzle from uncontrolled movement in a component mounting apparatus, having a shaft, a nozzle mounted at a lower end of the shaft for picking up and mounting components, and a shaft driving unit for moving the shaft upwards and downwards, comprising:

moving the shaft using a voice coil motor configured to apply a pressing force to the nozzle;

fixedly gripping the shaft at a predetermined position including a pair of levers pivotally connected at one end such that the pair of levers can swing in an open and close direction and means for forcing the pair of levers in the close direction; and releasing the gripping of the shaft only after the nozzle is enabled for picking up and mounting components including a release pin for opening the pair of levers by engaging a first end of the pair of levers opposite a pivotally connected second end and a driving means for driving the release pin toward the first end of the pair of levers only when the nozzle is picking up and mounting components.

9. A method of mounting an electronic component on a substrate with the electronic component picked up by at least one nozzle mounted on a shaft, the shaft movable and rotatable to align the nozzle with the electronic component, comprising:

providing a voice coil motor configured to apply a controlled pressing force on the nozzle;

providing a grasping unit that can hold the shaft and nozzle in a fixed position;

biasing the grasping unit to a hold position; and releasing the grasping unit from the hold position only when the electronic component is to be picked up and mounted while maintaining the biasing hold position during the remaining of the time of operation.

* * * * *